(12) United States Patent
Kikuchi et al.

(10) Patent No.: US 7,541,313 B2
(45) Date of Patent: Jun. 2, 2009

(54) METHOD FOR PRODUCING MGB$_2$ SUPERCONDUCTOR

(75) Inventors: Akihiro Kikuchi, Ibaraki (JP); Kiyoshi Inoue, Ibaraki (JP); Yasuo Iijima, Ibaraki (JP); Yuji Yoshida, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 275 days.

(21) Appl. No.: 10/547,555

(22) PCT Filed: Mar. 4, 2004

(86) PCT No.: PCT/JP2004/002727

§ 371 (c)(1),
(2), (4) Date: May 26, 2006

(87) PCT Pub. No.: WO2004/078650

PCT Pub. Date: Sep. 16, 2004

(65) Prior Publication Data

US 2007/0004048 A1    Jan. 4, 2007

(30) Foreign Application Priority Data

Mar. 4, 2003    (JP) .............................. 2003-057741

(51) Int. Cl.
*H01L 35/34* (2006.01)
*C04B 35/58* (2006.01)

(52) U.S. Cl. .................. 505/450; 505/121; 505/492; 505/500; 505/231; 505/300; 505/490; 505/501; 505/776; 505/782; 505/784; 505/785; 252/521.4

(58) Field of Classification Search .................. 505/450, 505/121, 492, 500, 231, 300, 490, 501, 776, 505/782, 784, 785; 252/521.4
See application file for complete search history.

(56) References Cited

U.S. PATENT DOCUMENTS

| | | | | |
|---|---|---|---|---|
| 6,626,995 | B2 * | 9/2003 | Kim et al. | 117/101 |
| 6,630,427 | B2 * | 10/2003 | Dunand | 505/452 |
| 6,946,428 | B2 * | 9/2005 | Rey | 505/237 |
| 6,956,011 | B2 * | 10/2005 | Akimitsu et al. | 505/100 |
| 7,018,954 | B2 * | 3/2006 | Thieme et al. | 505/430 |
| 7,378,376 | B2 * | 5/2008 | Holcomb | 505/452 |
| 2004/0124086 | A1 * | 7/2004 | Giunchi et al. | 205/51 |

FOREIGN PATENT DOCUMENTS

| | | |
|---|---|---|
| JP | 2002-274841 | 9/2002 |
| JP | 2002-324445 | 11/2002 |
| JP | 2002-352648 | 12/2002 |
| WO | WO02093659 A2 * | 11/2002 |

* cited by examiner

*Primary Examiner*—Douglas McGinty
(74) *Attorney, Agent, or Firm*—Wenderoth, Lind & Ponack, L.L.P.

(57) ABSTRACT

A alloy (Mg—X) of metal (X) and Mg in a liquid phase is made to react with B in a solid phase at a low temperature to manufacture a superconductor, which contains a large amount of MgB$_2$ potential for MRI, linear motorcar, superconducting cavity, electric power transmission cable, high-magnetic field magnet for medical units, electric power storage (SMES), and the like and is formed in the shape of bulk, wire, and foil, by heat treatment performed at a low temperature for a short time and at low cost.

15 Claims, 1 Drawing Sheet

US 7,541,313 B2

METHOD FOR PRODUCING MGB$_2$ SUPERCONDUCTOR

TECHNICAL FIELD

The invention of this application relates to a method of manufacturing a MgB$_2$ superconductor. More specifically, the invention of this application relates to a new method of manufacturing a superconductor that is useful for a MRI, a linear motorcar, a superconducting cavity, an electric power transmission cable, a high-magnetic field magnet for medical units, an electric power storage (SMES), and the like and contains MgB$_2$ to be used at the highest temperature among metal-based superconductors as a main component and is formed in the shape of bulk, wire, foil, and the like by heat treatment performed at a low temperature and for a short time.

BACKGROUND ART

The conventionally known superconductors are broadly divided into a copper oxide superconductor made of copper oxide and a non-copper oxide superconductor made of material other than copper oxide. Among them, the copper oxide superconductor has a higher superconducting dislocation temperature (Tc) than the non-copper oxide superconductor. However, the copper oxide superconductor has a drawback that it is hard to work because it is ceramic made of copper and oxygen and having the so-called two-dimensional surface structure. Further, on the other hand, an intermetallic compound made of only a plurality of metal elements such as MgB$_2$ has been known as a non-copper oxide superconductor (patent document 1).

[Patent document 1] Japanese Patent Application Laid-Open No. 2002-211916

This superconductor made of MgB$_2$ is comparatively easily formed and worked as compared with the copper oxide superconductor. However, even the intermetallic compound of MgB$_2$ that is comparatively easily formed and worked as compared with the copper oxide superconductor has the following drawbacks: in a conventional manufacturing method of making Mg of a liquid phase react with B of a solid phase or making Mg of a gas phase react with B of a solid phase, heat treatment performed at a high temperature for a long time or a condition of high pressure is required and hence the manufacturing of the MgB$_2$ superconductor is not practical; and in a method of using the solid phase diffusion reaction of Mg of a solid phase and B of a solid phase, the rate of formation is extremely slow.

Further, the superconductor manufactured by any one of the conventional manufacturing methods has not been always satisfactory in practical performance such as Jc characteristic and strain-resistance characteristic.

Hence, the object of the invention of this application is to provide a new method of manufacturing a MgB$_2$ superconductor by which a superconductor, whose main component is MgB$_2$ excellent in the above-described practical characteristics, can be manufactured easily and efficiently by heat treatment performed at or in the vicinity of a normal pressure and at a lower temperature and for a short time.

DISCLOSURE OF THE INVENTION

In order to solve the above problems, firstly, the invention of this application provides a A method of manufacturing a MgB$_2$ superconductor which comprises making a Mg—X alloy of an alloy of Mg and an element X forming an alloy having a lower melting point than the melting point of Mg react with B through diffusional reaction at a temperature of 800° C. or lower to manufacture a superconductor having MgB$_2$ as a main component. Secondly, the invention provides a method of manufacturing a MgB$_2$ superconductor, wherein the Mg—X alloy is made to react with B through diffusional reaction at a temperature range from 400° C. to 800° C. Thirdly, the invention provided a method of manufacturing a MgB$_2$ superconductor, wherein the Mg—X alloy is made to react with B through diffusional reaction at a temperature in the vicinity of 650° C. for 4 hours or more. Fourthly, the invention provides a method of manufacturing a MgB$_2$ superconductor, wherein the Mg—X alloy is made to react with B through diffusional reaction in a vacuum or in an inert gas atmosphere.

Then, as for the above-described method, fifthly, the invention of this application provides a method of manufacturing a MgB$_2$ superconductor, wherein the element X is one element or more selected from a group consisting of Ag, Cu, Sn, Ga, Pb, In, Bi, and Zn.

Further, the invention of this application, sixthly, provides a method of manufacturing a MgB$_2$ superconductor, wherein a mixture of the Mg—X alloy and B is worked or overlaid on a base material and then is subjected to heat treatment. Seventhly, the invention provides a method of manufacturing a MgB$_2$ superconductor, wherein the mixture of the Mg—X alloy and B is crammed into a metal pipe to be plastically deformed and is drawn into a wire and that the wire is then subjected to heat treatment. Eighthly, the invention provides a method of manufacturing a MgB$_2$ superconductor wherein the mixture of the Mg—X alloy and B is crammed into a metal pipe to be plastically deformed and is drawn into a wire and that the wire is then subjected to heat treatment to form a single filament wire and that a large number of obtained single filament wires are crammed into the same metal pipe and are drawn into a wire to form an extremely-fine multifilament wire and that the extremely-fine multifilament wire is subjected to heat treatment. Ninthly, the invention provides a method of manufacturing a MgB$_2$ superconductor, wherein the mixture of the Mg—X alloy and B is dispersed in an organic solvent to produce a solution and that the solution is applied to a heat-resistant substrate and then is subjected to heat treatment. Tenthly, the invention provided a method of manufacturing a MgB$_2$ superconductor, wherein wire-shaped B is heated and is passed through a bath of the Mg—X alloy brought into a molten state previously at its heating temperature to overlay the Mg—X alloy on a surface of the wire-shaped B and then is subjected to heat treatment.

Still further, eleventhly, the invention provides a method of manufacturing a MgB$_2$ superconductor wherein X in the Mg—X alloy is 50 at % or less C for Mg. Twelfthly, the invention provides a method of manufacturing a MgB$_2$ superconductor, wherein X in the Mg—X alloy is 35 at % or less Ag for Mg. Then, thirteenthly, the invention provides a method of manufacturing a MgB$_2$ superconductor, wherein X in the Mg—X alloy is 25 at % or less or from 50 at % to 95 at % Sn for Mg. Further, fourteenthly, the invention provides a method of manufacturing a MgB$_2$ superconductor, wherein X in the Mg—X alloy is 95 at % or less Ga for Mg. Fifteenthly, the invention provides a method of manufacturing a MgB$_2$ superconductor wherein X in the Mg—X alloy is 95 at % or less Pb for Mg. Sixteenthly, the invention provides a method of manufacturing a MgB$_2$ superconductor wherein X in the Mg—X alloy is 95 at % or less In for Mg. Seventeenthly, the invention provides a method of manufacturing a MgB$_2$ superconductor characterized in that X in the Mg—X alloy is 30 at % or less or from 45 at % to 95 at % Bi for Mg. Eighteenthly, the invention provides a method of manufacturing a $MgB_2$ superconductor wherein X in the Mg—X alloy is 95 at % or less Zn for Mg.

Figure 1:
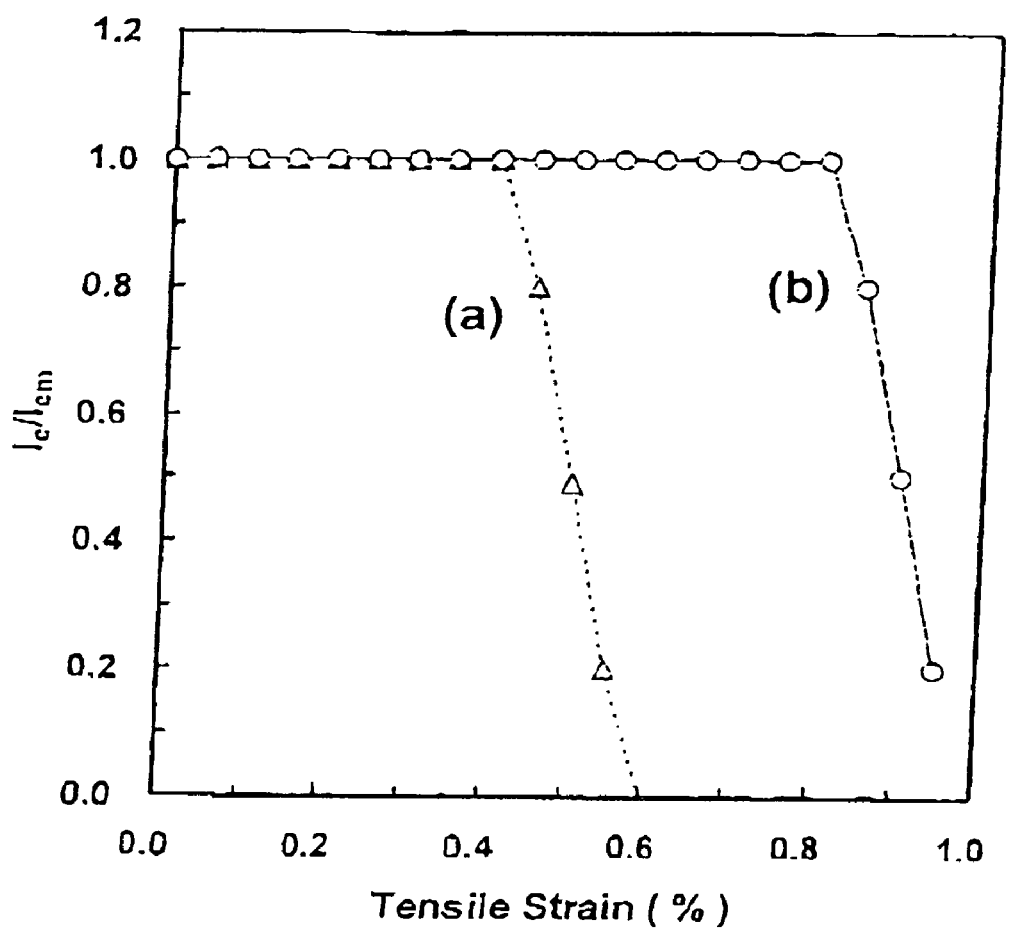
FIG. 1 is a graph to show a change in Ic caused by a tensile strain of a $MgB_2$ wire in the comparison between (a) and (b)

(a) is a $MgB_2$ wire manufactured by the reaction of Mg and B, (b) is a $MgB_2$ wire manufactured by the reaction of Mg—Cu alloy and B.

BEST MODE FOR CARRYING OUT THE INVENTION

The invention of this application has the above-described features and the embodiments of the invention will be described below.

According to the invention of this application, a Mg—X alloy made of Mg and a third element of X and having a low melting point is previously formed before Mg (magnesium) is made to react directly with B (boron), and the formed Mg—X alloy having a low melting point is heated at a low temperature, thereby being reduced to a liquid phase, and then the Mg—X alloy reduced to the liquid phase is made to react with B by diffusion.

In the invention of this application, as for the requirements of the third element (X) forming an alloy with Mg, the melting point of the Mg—X alloy to be formed needs to be lower than the melting point (650° C.) of Mg. Further, it is desired that when X reacts with B, a two-dimensional compound such as X—B or a three-dimensional compound such as X—Mg—B is not formed. As the third element (X) suitably satisfying this requirements is considered one or more kind of Ag (silver), Cu (copper), Sn (tin), Ga (gallium), Pb (lead), In (indium), Bi (bismuth), and Zn (zinc).

By utilizing the specific third element (X) that reacts with Mg to form an alloy to lower the melting point of Mg in this manner, the invention of this application makes it possible to manufacture a superconductor, which has $MgB_2$ excellent in the practical characteristics (Jc characteristic, strain-resistance characteristic) as a main component and is formed in the shape of bulk, wire, or foil, only by performing heat treatment at a low temperature for a short time under a reduced pressure, a normal pressure, or the application of pressure.

The physical properties of the $MgB_2$ superconductor manufactured by the invention of this application differ depending on the alloy ratio of the third element (X) to Mg and the reaction temperature when the formed Mg—X alloy is made to react with B, and the mode of the invention will be described in detail in the embodiments. Further, the mode of method of manufacturing a superconductor formed in the shape of bulk, wire, and foil will be described also in the embodiments.

When Cu (copper) or Ag (silver) is used as the third element (X), a Mg—Cu alloy or a Mg—Ag alloy are formed and when this Mg—Cu alloy or Mg—Ag alloy is made to react with B to manufacture $MgB_2$, as a byproduct, a Cu-based dilute alloy phase or a Ag-based dilute alloy phase is formed as the second phase. The Cu-based dilute alloy phase or the Ag-based dilute alloy phase formed as the second phase plays a role in preventing the occurrence of cracks in the $MgB_2$ phase even when a strain is applied to the $MgB_2$ superconductor, thereby improving brittleness. Hence, even if a high strain occurs in the $MgB_2$ superconductor, the $MgB_2$ superconductor is not degraded in superconducting characteristics and hence can be easily handled.

Further, when a third element (X) is selected that forms the second phase forming a Cu-based dilute alloy phase or a Ag-based dilute alloy phase excellent in electric conductivity, even if a superconducting state is locally broken, an electric current bypasses the locally broken portion and passes the Cu-based dilute alloy phase or the Ag-based dilute alloy of the second phase to prevent heating, which produces an effect of stabilizing the superconducting state.

In addition, the invention of this application can provide a superconductor having an extremely large Jc at low cost to reduce the amount of use of the superconductor. Further, the formed second phase has an action to strengthen the superconductor also mechanically and hence the superconductor is excellent in resistance to an external force such as electromagnetic force or the like.

Hence, the embodiments will be shown and described in more detail. The invention is not limited by the following embodiments.

EMBODIMENT

Embodiment 1

An alloy powder of Mg-33 at % Cu was mixed with a B powder at a mol ratio of Mg:B=1:2 and the mixed alloy powder was pressed and then was subjected to heat treatment in a vacuum at 450° C. for 500 hours, at 550° C. for 100 hours, at 600° C. for 4 hours, and at 750° C. for 0.5 hours, which revealed that there were produced superconductors having a Tc of 23 K, 38.5 K, 39.1 K, 39.3 K, and 21 K. A clear diffraction pattern of $MgB_2$ was obtained by the X-ray diffraction of this substance. It was recognized from this diffraction pattern that a bulk-shaped $MgB_2$ superconductor was obtained. In this regard, it was recognized by EDAX observation that a Cu-based dilute alloy phase was formed in the sample in addition to the $MgB_2$ phase. Further, even when the ratio of Cu in the alloy with Mg was increased to 50 at %, an excellent superconducting substance was obtained.

Further, while the above-described heat treatment was performed in the vacuum, it was recognized that the heat treatment could be performed in an inert gas atmosphere such as argon or nitrogen.

On the other hand, when an alloy powder of Mg-55 at % Cu was used, it was not easy to form $MgB_2$ at a heating temperature lower than 800° C., and although $MgB_2$ could be formed at a heating temperature higher than 800° C., superconducting characteristics were not practically sufficient.

Embodiment 2

An alloy powder of Mg-20 at % Ag was mixed with a B powder at a mol ratio of Mg:B=1:2 and the mixed powder was pressed and then was subjected to heat treatment in a vacuum at 450° C. for 500 hours, at 550° C. for 100 hours, at 600° C. for 10 hours, at 650° C. for 4 hours, and at 750° C. for 1.5 hours, which revealed that there were produced superconductors having a Tc of 22.1 K, 34.7 K, 39.2 K, 39.3 K, and 19.9 K. A clear diffraction pattern of $MgB_2$ was obtained by the X-ray diffraction of this substance. In this regard, it was recognized by EDAX observation that a Ag-based dilute alloy phase was formed in the sample in addition to the $MgB_2$ phase. Further, even when the ratio of Ag in the alloy with Mg was increased to 35 at %, an excellent superconducting substance was obtained.

On the other hand, when an alloy powder of Mg-40 at % Ag was used, a practically satisfactory superconductor was not always obtained.

Embodiment 3

An alloy powder of Mg-15 at % Sn was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 31.7 K, 38.8 K, and 39.3 K. A clear diffraction pattern of $MgB_2$ was obtained by the X-ray diffraction of this substance. In this regard, it was recognized by EDAX observation that a Sn-based dilute alloy phase was formed in the sample in addition to the $MgB_2$ phase.

Further, an alloy powder of Mg-60 at % Sn was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 30.3 K, 36.5 K, and 39.2 K. A clear diffraction pattern of $MgB_2$ was obtained by the X-ray diffraction of this substance. In this regard, it was recognized by EDAX observation that a Sn-based dilute alloy phase was formed in the sample in addition to the $MgB_2$ phase.

On the other hand, when an alloy powder of Mg-33 at % Sn was mixed with a B powder at a mol ratio of Mg:B=1:2 and the mixed alloy powder was pressed and then was subjected to heat treatment in a vacuum at a temperature higher than 800° C., it was recognized that a small amount of $MgB_2$ was formed but a substance having excellent superconducting characteristics was not obtained.

Further, when an alloy powder of Mg-96 at % Sn was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, it was clearly recognized that $MgB_2$ was formed in the sample but a superconducting current density per whole cross-sectional area of the sample, that is, an overall Jc (4.2 K, 3 T) was 20 A/cm$^2$, which was not sufficiently satisfactory from a practical point of view.

From the above results, it was recognized that in the alloy of Sn and Mg, an excellent superconducting substance was obtained within a range where Sn is 25 at % or less or from 50 at % to 95 at %.

Embodiment 4

An alloy powder of Mg-28 at % Ga was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 29.7 K, 37.7 K, and 39.2 K. A clear diffraction pattern of $MgB_2$ was obtained by the X-ray diffraction of this substance. In this regard, it was recognized by EDAX observation that a Ga-based dilute alloy phase was formed in the sample in addition to the $MgB_2$ phase.

On the other hand, an alloy of Mg-96 at % Ga having a melting point near room temperature was brought into a molten state at 200° C. and was mixed with a B powder at a mol ratio of Mg:B=1:2 and the mixed substance was subjected to heat treatment in a vacuum at 550° C. for 100 hours, at 600° C. for 10 hours, and at 650° C. for 4 hours. Then, it was clearly recognized that $MgB_2$ was formed in a liquid phase of Ga but that the amount of $MgB_2$ was not necessarily large. Hence, from a practical point of view, it was recognized that it was preferable to utilize an alloy having a Ga concentration of 95 at % or less.

Embodiment 5

An alloy powder of Mg-33 at % Pb was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 28.6 K, 38.3 K, and 39.1 K. A clear diffraction pattern of $MgB_2$ was obtained by the X-ray diffraction of this substance. In this regard, it was recognized by EDAX observation that a Pb-based dilute alloy phase was formed in the sample in addition to the $MgB_2$ phase. Further, it was recognized that even when the ratio of Pb in the alloy with Mg was increased to 95 at %, an excellent superconducting substance was obtained.

On the other hand, when an alloy powder of Mg-96 at % Pb was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, it was recognized that $MgB_2$ was formed in all samples but a superconducting current density per whole cross-sectional area of the sample, that is, an overall Jc (4.2 K, 3 T) was 16 A/cm$^2$, which was not necessarily practical.

Embodiment 6

An alloy powder of Mg-20 at % In was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 28.6 K, 38.3 K, and 39.1 K. A clear diffraction pattern of $MgB_2$ was obtained by the X-ray diffraction of this substance. In this regard, it was recognized by EDAX observation that an In-based dilute alloy phase was formed in the sample in addition to the $MgB_2$ phase.

Further, it was recognized that $MgB_2$ was formed even in the case of Mg-96 at % In. However, it was recognized that since the amount of $MgB_2$ was small, from a practical point of view, it was preferable to make the ratio of In smaller than 95 at %.

Embodiment 7

An alloy powder of Mg-90 at % Zn was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 23.5 K, 28.4 K, and 32.8 K. A clear diffraction pattern of $MgB_2$ was obtained by the X-ray diffraction of this substance. In this regard, it was recognized by EDAX observation that a Zn-based dilute alloy phase was formed in the sample in addition to the $MgB_2$ phase.

Further, it was recognized that $MgB_2$ was formed even in the case of Mg-96 at % Zn. However, it was recognized that since the amount of $MgB_2$ was small, from a practical point of view, it was preferable to make the ratio of Zn smaller than 95 at %.

Embodiment 8

An alloy powder of Mg-25 at % Bi was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 30.4 K, 32.1 K, and 36.8 K. A clear diffraction pattern of $MgB_2$ was obtained by the X-ray diffraction of this substance. In this regard, it was recognized by EDAX observation that a Bi-based dilute alloy phase was formed in the sample in addition to the $MgB_2$ phase.

Further, an alloy powder of Mg-60 at % Bi was mixed with a B powder at a mol ratio of Mg:B=1:2 and the mixed alloy powder was pressed and then was subjected to heat treatment in a vacuum at 550° C. for 100 hours, at 600° C. for 10 hours, and at 650° C. for 4 hours, which revealed that there were produced superconductors having a Tc of 30.3 K, 36.5 K, and 39.2 K. A clear diffraction pattern of $MgB_2$ was obtained by the X-ray diffraction of this substance. In this regard, it was recognized by EDAX observation that a Bi-based dilute alloy phase was formed in the sample in addition to the $MgB_2$ phase.

On the other hand, an alloy powder of Mg-33 at % Bi was mixed with a B powder at a mol ratio of Mg:B=1:2 and the mixed alloy powder was pressed and then was subjected to heat treatment in a vacuum at temperatures lower than 800° C. and higher than 800° C. As a result, at a temperature lower than 800° C., it was not recognized that marked $MgB_2$ was formed and at a temperature higher than 800° C., it was recognized that a small amount of $MgB_2$ was formed but a substance having excellent superconducting characteristics was not obtained.

Further, an alloy powder of Mg-96 at % Bi was mixed with a B powder at a mol ratio of Mg:B=1:2 and the mixed alloy powder was pressed and then was subjected to heat treatment in a vacuum in a vacuum at 550° C. for 100 hours, at 600° C. for 10 hours, and at 650° C. for 4 hours. It was clearly recognized that $MgB_2$ was formed in the sample but it turned out that a superconducting current density per the whole cross-sectional area of the sample was not suitable for practical use.

From the above results, it turned out that a desirable superconducting substance can be obtained when Bi is 30 at % or less or from 45 at % to 95 at %.

Embodiment 9

An alloy powder of Mg-33 at % Cu was mixed with a B powder at a mol ratio of Mg:B=1:2 and the mixed alloy powder was crammed into a stainless pipe and then was drawn into a wire and then was subjected to heat treatment in a vacuum at 550° C. for 100 hours, at 600° C. for 10 hours, and at 650° C. for 4 hours, whereby superconductors having a Tc of 38.5 K, 39.1 K, and 39.3 K were obtained. Further, values of 950 A/mm$^2$, 1120 A/mm$^2$, and 1230 A/mm$^2$ were obtained as overall superconducting current densities Jc under conditions of 4.2 K and 3 T.

When taking it into consideration that an overall Jc under usage magnetic field and temperature of a superconductor at a practical state is 200 A/mm$^2$ or more, the value at the commercially practical stage as the value of Jc under conditions of 4.2 K and 3 T was obtained.

Further, as is clear from the above embodiments 1 to 8, even if the third element (X) is any one of them, in the case where the ratio of the third element (X) to Mg is the specific value, when the third element (X) is made to react with Mg with a reaction temperature set at or in the vicinity of 650° C. or more and for 4 hours or more, in most cases, a $MgB_2$ superconductor having excellent physical properties can be obtained.

Embodiment 10

An alloy powder of Mg-33 at % Pb was mixed with a B powder at a mol ratio of Mg:B=1:2 and the mixed alloy powder was crammed into a stainless pipe and then was drawn into a wire and then was subjected to heat treatment in a vacuum at 650° C. for 4 hours to manufacture wires.

Then, a tensile strain was applied to each of a $MgB_2$ wire (a) made of an alloy powder of Mg-33 at % Pb and a B powder and a $MgB_2$ wire (b) made of an alloy powder of Mg-33 at % Cu and a B powder and the deterioration of Ic was measured and the measurement results are shown in FIG. 1.

As is clear from FIG. 1, in the $MgB_2$ wire (b) not containing Cu, the deterioration of Ic starts at a strain of 0.4% whereas in the $MgB_2$ wire (a) containing Cu, the deterioration of Ic does not occur until strain becomes larger than 0.8%. It can be thought that this is because the Cu-based dilute alloy of the second phase can produce an effect of preventing the occurrence of cracks in $MgB_2$. This means that the $MgB_2$ wire (a) containing Cu can be practically used for wires used in the state of large tensile strain.

Embodiment 11

An alloy powder of Mg-33 at % Cu was mixed with a B powder at a mol ratio of Mg:B=1:2 and the mixed alloy powder was crammed into a copper pipe and then was drawn into a wire and then was subjected to heat treatment in a vacuum at 550° C. for 100 hours, at 600° C. for 10 hours, and at 650° C. for 4 hours, whereby superconductors each having an overall Jc of 960 A/mm$^2$, 1180 A/mm$^2$, and 1310 A/mm$^2$ under conditions of 4.2 K and 1 T were obtained. It turned out that a transition from a superconducting state to a normal conducting state was moderate and that a branch flow to the copper pipe was produced to make a superconducting state stable. Then, the 120 single wires obtained in this manner were bundled and crammed into a copper pipe again and then were drawn into a wire and then the drawn wire was subjected to heat treatment in a vacuum at 550° C. for 100 hours, at 600° C. for 10 hours, and at 650° C. for 4 hours. The obtained extremely-fine multifilament wire was further improved in superconducting characteristics, that is, when the measurement of a magnetization curve was made on the wire, a jump in magnetic susceptibility, which is thought to be associated with a flux jump, was not observed at all.

Embodiment 12

An alloy powder of Mg-66 at % Cu was mixed with a B powder at a mol ratio of Mg:B=1:2 and the mixed alloy powder was crammed into a silver pipe and then was drawn into a wire and then was subjected to heat treatment in a vacuum at 650° C. for 10 hours. Then, the same tensile strain as in embodiment 10 was applied to the wire and the deterioration of Ic was measured. As a result, a stabilized wire showing the same physical properties as the $MgB_2$ wire (b) in embodiment 10 was obtained.

Embodiment 13

A B filament is passed through a furnace at 500° C., thereby being previously heated, and then the heated B filament was passed through a bath of alloy of Mg-60 at % In in a molten state at 500° C. at a speed of 1 m/sec to cover the surface of the B filament with the alloy of Mg-60 at % In. Then, this wire is subjected to heat treatment at 650° C. for 10 hours to manufacture $MgB_2$ on the surface of the B filament. It was recognized that this wire had a Tc of 39.1 K and an overall Jc of 980 A/mm$^2$ under conditions of 4.2 K and 3 T. With this, it was shown that a wire-shaped superconductor could be manufactured by a method other than a wire drawing method.

Embodiment 14

An alloy powder of Mg-33 at % Cu was mixed with a B powder at a mol ratio of Mg:B=1:2 and the mixed alloy powder was dispersed in an organic solvent (trichloroethylene) in the state of sol to make a solution. Then, the solution was applied to the surface of an iron-based substrate and was dried and then was subjected to heat treatment in a vacuum at 650° C. for 10 hours to make a film (foil). The film (foil) had a Tc of 39.1 K and an overall Jc of 300 A/mm$^2$ under conditions of 4.2 K and 3 T. Further, these values are high values showing that the film can be commercially used as a superconducting thin film.

Embodiment 15

An alloy powder of Mg-33 at % Cu was mixed with a B powder at a mol ratio of Mg:B=1:2 and the mixed alloy powder was pressed and subjected to heat treatment in an argon atmosphere under one atmospheric pressure. At a temperature lower than 400° C., it was not recognized that marked $MgB_2$ was formed and at a temperature higher than 800° C., it was recognized that Mg was markedly evaporated to form porous $MgB_2$ On the other hand, within a temperature range from 400° C. to 800° C., a superconductor having a physical property similar to $MgB_2$ having a high Tc and obtained in the embodiment 1 was manufactured. With this, it was recognized that the same reaction occurs not only in a vacuum but also in an inert gas.

INDUSTRIAL APPLICABILITY

According to the invention of this application, it is possible to manufacture such a superconductor with ease and at low cost that is suitably used for MRI, linear motorcar, superconducting cavity, electric power transmission cable, high-magnetic field magnet for medical units, electric power storage (SMES), and the like and contains $MgB_2$ as a main component and is formed in the shape of bulk, wire, or foil. In the superconductor manufactured in this method, the second phase formed as a byproduct produces improvements in the stabilization of current and mechanical reinforcement.

The invention claimed is:

1. A method of manufacturing a $MgB_2$ superconductor which comprises making a Mg—X alloy react with B through diffusional reaction at a temperature of 800° C. or lower to manufacture a superconductor having $MgB_2$ as a main component, wherein the Mg—X alloy is an alloy of Mg and an element X forming an alloy having a lower melting point than the melting point of Mg, and X is from 25 at % to 30 at % or from 45 at % to 95 at % of Bi based on Mg.

2. The method of manufacturing a $MgB_2$ superconductor according to claim 1, wherein the Mg—X alloy is made to react with B through diffusional reaction at a temperature range from 400° C. to 800° C.

3. The method of manufacturing a $MgB_2$ superconductor according to claim 2, wherein the Mg—X alloy is made to react with B through diffusional reaction at a temperature in the vicinity of 650° C. for 4 hours or more.

4. The method of manufacturing a $MgB_2$ superconductor according to claim 1, wherein the Mg—X alloy is made to react with B through diffusional reaction in a vacuum or in an inert gas atmosphere.

5. The method of manufacturing a $MgB_2$ superconductor according to claim 1, wherein a mixture of the Mg—X alloy and B is worked or overlaid on a base material and then is subjected to heat treatment.

6. The method of manufacturing a $MgB_2$ superconductor according to claim 5, wherein the mixture of the Mg—X alloy and B is crammed into a plastically deformable metal pipe and is drawn into a wire and then the wire is subjected to heat treatment.

7. The method of manufacturing a $MgB_2$ superconductor according to claim 5, wherein the mixture of the Mg—X alloy and B is crammed into a plastically deformable metal pipe and is drawn into a wire and then the wire is subjected to heat treatment to form a single filament wire and a large number of obtained single filament wires are crammed into a similar metal pipe and are drawn into a wire to form an extremely-fine multifilament wire and the extremely-fine multifilament wire is subjected to heat treatment.

8. The method of manufacturing a $MgB_2$ superconductor according to claim 5, wherein the mixture of the Mg—X alloy and B is dispersed in an organic solvent to produce a dispersion and the dispersion is applied to a heat-resistant substrate and then is subjected to heat treatment.

9. The method of manufacturing a $MgB_2$ superconductor according to claim 5, wherein wire-shaped B is heated and is passed through a bath of the Mg—X alloy brought into a molten state previously at the heating temperature to overlay the Mg—X alloy on a surface of the wire-shaped B and then is subjected to heat treatment.

10. A method of manufacturing a $MgB_2$ superconductor which comprises making a Mg—X alloy react with B through diffusional reaction at a temperature from 550° C. to 650° C. to manufacture a superconductor having $MgB_2$ as a main component, wherein the Mg—X alloy is an alloy of Mg and an element X forming an alloy having a lower melting point than the melting point of Mg, and X is 95 at % or lower of Ga based on Mg.

11. The method of manufacturing a $MgB_2$ superconductor according to claim 10, wherein a mixture of the Mg—X alloy and B is worked or overlaid on a base material and then is subjected to heat treatment.

12. The method of manufacturing a $MgB_2$ superconductor according to claim 10, wherein the mixture of the Mg—X alloy and B is crammed into a plastically deformable metal pipe and is drawn into a wire and then the wire is subjected to heat treatment.

13. The method of manufacturing a $MgB_2$ superconductor according to claim 10, wherein the mixture of the Mg—X alloy and B is crammed into a plastically deformable metal pipe and is drawn into a wire and then the wire is subjected to a heat treatment to form a single filament wire and a large number of obtained single filament wires are crammed into a similar metal pipe and are drawn into a wire to form an extremely-fine multifilament wire and the extremely-fine multifilament wire is subject to heat treatment.

14. The method of manufacturing a $MgB_2$ superconductor according to claim 10, wherein the mixture of the Mg—X alloy and B is dispersed in an organic solvent to produce a dispersion and the dispersion is applied to a heat-resistant substrate and then is subjected to heat treatment.

15. The method of manufacturing a $MgB_2$ superconductor according to claim 10, wherein wire-shaped B is heated and is passed through a bath of the Mg—X alloy brought into a molten state previously at the heating temperature to overlay the Mg—X alloy on a surface of the wire-shaped B and then is subjected to heat treatment.

* * * * *